(12) United States Patent
Smith et al.

(10) Patent No.: US 8,334,738 B2
(45) Date of Patent: Dec. 18, 2012

(54) FAULT INTERRUPTING AND RECLOSING DEVICE

(75) Inventors: Richard G. Smith, North Aurora, IL (US); Jason R. Bogusz, Chicago, IL (US); Michael G. Ennis, Evanston, IL (US); Gary W. Hardesty, Northfield, IL (US); Thomas E. Kovanko, Chicago, IL (US); Richard P. Mikosz, Hickory Hills, IL (US); Andrew D. Pfister, Rolling Meadows, IL (US); Roy T. Swanson, La Grange Park, IL (US); Keith W. Benson, IV, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 467 days.

(21) Appl. No.: 12/095,067

(22) PCT Filed: Nov. 17, 2006

(86) PCT No.: PCT/US2006/044547
§ 371 (c)(1),
(2), (4) Date: Jul. 16, 2008

(87) PCT Pub. No.: WO2007/064489
PCT Pub. Date: Jun. 7, 2007

(65) Prior Publication Data
US 2008/0309437 A1    Dec. 18, 2008

Related U.S. Application Data

(60) Provisional application No. 60/739,894, filed on Nov. 28, 2005, provisional application No. 60/761,941, filed on Jan. 25, 2006.

(51) Int. Cl.
*H01H 75/04* (2006.01)
*H02H 5/00* (2006.01)
(52) U.S. Cl. ............... 335/18; 361/72; 361/77; 361/115
(58) Field of Classification Search ............ 361/72, 361/77, 115
See application file for complete search history.

(56) References Cited

U.S. PATENT DOCUMENTS
2,597,134 A    5/1952   Stratton
2,693,514 A   11/1954   Smith
(Continued)

OTHER PUBLICATIONS

International Search Report for Application No. PCT/US06/044547 dated Jun. 21, 2007.

*Primary Examiner* — Rexford Barnie
*Assistant Examiner* — Angela Brooks (57) ABSTRACT

A fault interrupting and reclosing device includes a circuit interrupter coupled to an actuator. The actuator includes at least one force generating element for generating an opening force for opening the circuit interrupter and for generating a restoring force to close the circuit interrupter. The device further includes a latch to engage the actuator to hold the contacts open once opened. In a preferred arrangement, the device is provided with an automatic mode of operation including a reclose process and a non-reclosing mode of operation. The device also preferably includes a method of determining the end-of-life of a vacuum interrupter monitors characteristics and/or parameters of a fault current or vacuum interrupter operation to predict a percent of life consumed with each fault current interruption operation. A cumulative percent of life consumed may also be determined, and an end-of-life may be predicted based upon the cumulative percent of life consumed.

11 Claims, 7 Drawing Sheets

U.S. PATENT DOCUMENTS

| | | | |
|---|---|---|---|
| 2,843,699 A | | 7/1958 | Leatherberry |
| 3,321,721 A | * | 5/1967 | Smith, Jr. .................. 335/32 |
| 3,609,608 A | * | 9/1971 | Pokorny .................. 335/230 |
| 4,768,010 A | * | 8/1988 | Brown et al. .................. 337/169 |
| 4,795,996 A | * | 1/1989 | Brown et al. .................. 337/169 |
| 4,935,715 A | * | 6/1990 | Popeck .................. 337/169 |
| 5,103,364 A | * | 4/1992 | Kamp .................. 361/72 |
| 5,162,967 A | * | 11/1992 | Ojanguren Torrontegui 361/115 |
| 5,172,090 A | * | 12/1992 | Ranjan et al. .................. 337/169 |
| 5,612,661 A | * | 3/1997 | Twenter et al. .................. 337/169 |
| 6,522,228 B2 | * | 2/2003 | Wellner et al. .................. 335/18 |
| 2002/0179571 A1 | | 12/2002 | Rhein et al. |

* cited by examiner

FAULT INTERRUPTING AND RECLOSING DEVICE

TECHNICAL FIELD

This patent relates to a fault interrupting and reclosing device that also includes a method to determine the end-of-life or stated another way the remaining operational life of a vacuum fault interrupter of the fault interrupting and reclosing device.

BACKGROUND

Fault interrupting devices function to isolate a fault condition in a power distribution system. Upon clearing of the fault condition some fault interrupting devices are also operable to reclose the circuit. Faults in a power distribution system can occur for any number of reasons and are often transient. Detection and isolation of the fault mitigates damage to the system as a result of the fault. An ability to reclose the circuit following a fault without replacement of hardware components allows the power distribution system to be returned to normal operation quickly, and in some instances, without operator intervention.

Combined fault interrupting and recloser devices may be designed to operate or be operated after a fault interruption to reclose the faulted line or lines. Following reclosing, if the fault is not cleared the device will detect the fault and again operate to open the circuit to isolate the fault. When a fault is determined to be permanent, the fault interrupting device should act to isolate the circuit and prevent further reclosing attempts.

Several types of fault interrupting and reclosing devices incorporate vacuum interrupters to perform the circuit interrupting and subsequent reclosing functions. During current interrupting operation, as the vacuum interrupter contacts open, the contact surfaces are eroded, and some of that material is deposited on the insulating housing of the interrupter. Contact wear occurs with each operation, and therefore, the vacuum interrupter is capable only of a finite number of fault current interrupting operations. The number of fault interrupting operations may be specified for a particular fault protection device based upon design information and intended application. The fault interrupting and reclosing device may include a counter to track the number of operations.

The actual number of interrupting cycles a vacuum interrupter is capable of, and hence the fault interrupting and reclosing device incorporating the interrupter, depends on a number of operating characteristics including characteristics of the interrupted fault current and the operating characteristics of the vacuum interrupter. For example, material erosion and corresponding contact degradation become significantly more pronounced as the interrupted current increases. Thus, the number of cycles defining the life of the fault interrupting device is conservatively set to ensure the proper operation of the device throughout its specified life and over its rated current interrupting capacity. However, if the actual device infrequently sees duty interrupting near maximum fault current, this may result in devices being replaced with substantial remaining operational life. Similarly, devices which are not replaced in time may eventually be unable to clear a fault, resulting in mis-coordination and more customers without power.

DETAILED DESCRIPTION

A fault interrupting and reclosing device includes a circuit interrupting device such as a vacuum fault interrupter, an arc spinner interrupter or the like, coupled to an actuator. The actuator includes at least one force generating element for generating an operating force for operating the circuit interrupter to open the circuit, for example, to generate an opening force to open the contacts of the circuit interrupter, and for generating a restoring force to close circuit interrupter to close the circuit. The actuator may include an electromagnetic actuator such as a solenoid to drive the contacts open and a spring to close the contacts. The device may further include a latch, such as an electromechanical latch, to engage the actuator to retain the state of the circuit interrupter. For example, to hold the vacuum interrupter contacts closed when the circuit is closed and to hold the contacts open when the circuit is opened.

The fault interrupting and reclosing device may also include a pivot mounting and a mounting release latch. The pivot mounting and release latch engage a trunnion of the mounting structure. Upon detecting a persistent fault on the line segment associated with the device, the latch releases the device so that it may release from a connected position to a disconnected position. In the connected position, the device is physically coupled to a source and a load of a power distribution system. In the disconnected position, the device is disconnected from at least one of the supply and the load of the power distribution system. Moreover, in the disconnected or released position it is possible to visually discern the state of the device and hence to determine the faulted line segment associated with the device.

Figure 1:
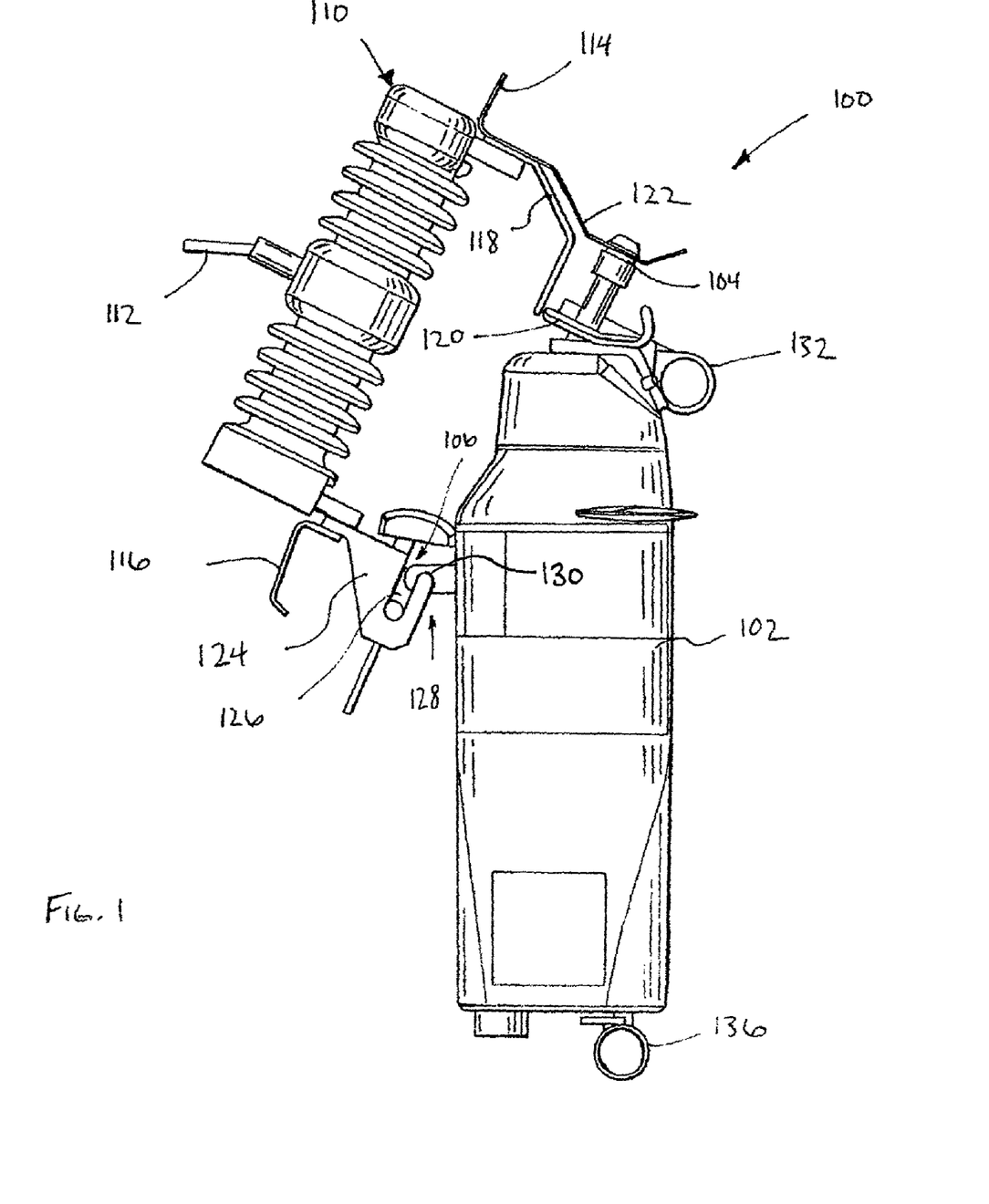
FIG. 1 is a graphic illustration of a fault interrupting reclosing device in a set or connected position wherein it is operable for connecting a source and load of a power distribution system.

Referring to FIG. 1, a fault interrupting and reclosing device 100 includes a housing 102 including a first tap 104 and a second tap 106. The housing 102, first tap 104 and second tap 106 are configured to allow the device 100 to couple to mounting 110, such as a mounting commonly referred to as a cutout mounting or other suitable mounting. The mounting 110 may include a support 112 permitting the mounting 110 to be secured to a pole or other structure (not depicted) for supporting the mounting 110 relative to the lines of the power distribution system. The first tap 104 may be secured to a supply coupling 114 of the mounting 110 and the second tap may be secure to a load coupling 116 of the mounting 110. The supply coupling 114 may include an alignment member 118 that engages an alignment member 120 of the device 100 for aligning the tap 104 relative to a contact 122 that electrically couples the tap 104 to the supply of the power distribution system.

The load mounting 116 may include a trunnion 124 secured to the mounting 110. The trunnion 124 is formed to include a channel 125 within which a sliding contact/pivot member 126 is disposed. The member 126 is coupled as part of a release mechanism 128 that provides for releasing the device 100 from the mounting 110, for example, after a predetermined number of failed reclose attempts.

FIG. 1 depicts the device in a connected position wherein the device is electrically coupled to both the supply side 114 and the load side 116 of the power distribution system via the cut out mounting 110. The device may also be disposed in a disconnected position. The device 100 includes a hook ring 132. Using a "hot stick" or other suitable insulated tool, and following all safety instructions and precautions, including, without limitation, ensuring the device 100 is not energized, a technician can grasp the hook ring, and pulling away from the cut out mounting 110, cause the tap 104 to separate from the strap 122. The strap 122 normally bears against the tap 104, the force of which is sufficient in normal operation to retain the device 100 in the connected state and ensure electrical conductivity. However, by applying a force to the hook ring 132, the tap 104 may be separated from the strap 122. Once separated, the device 100 is free to rotate about the pivot 130 away from the cut out mounting 110. If mounted vertically, as depicted in FIG. 1, gravity will act to cause the device 100 to rotate about the pivot 130 to a disconnect position. The hook ring 132 also allows the device 100 to be moved to the connected position depicted in FIG. 11

The device 100 may be operated, as will be explained, in an automatic mode. In the automatic mode, upon fault detection, the device 100 operates to open, without disconnecting from the power distribution system, to isolate the fault. The device 100 may then attempt to reclose one or more times. If after reclosure the fault is no longer detected, the device 100 remains closed. If, however, the fault is persistent, the device 100 will again open. After a predetermined number of reclose attempts, the release mechanism acts to release the device 100 from the mounting 110 allowing the device to drop out of the connected state shown in FIG. 1 and into the disconnected state.

Figure 2:
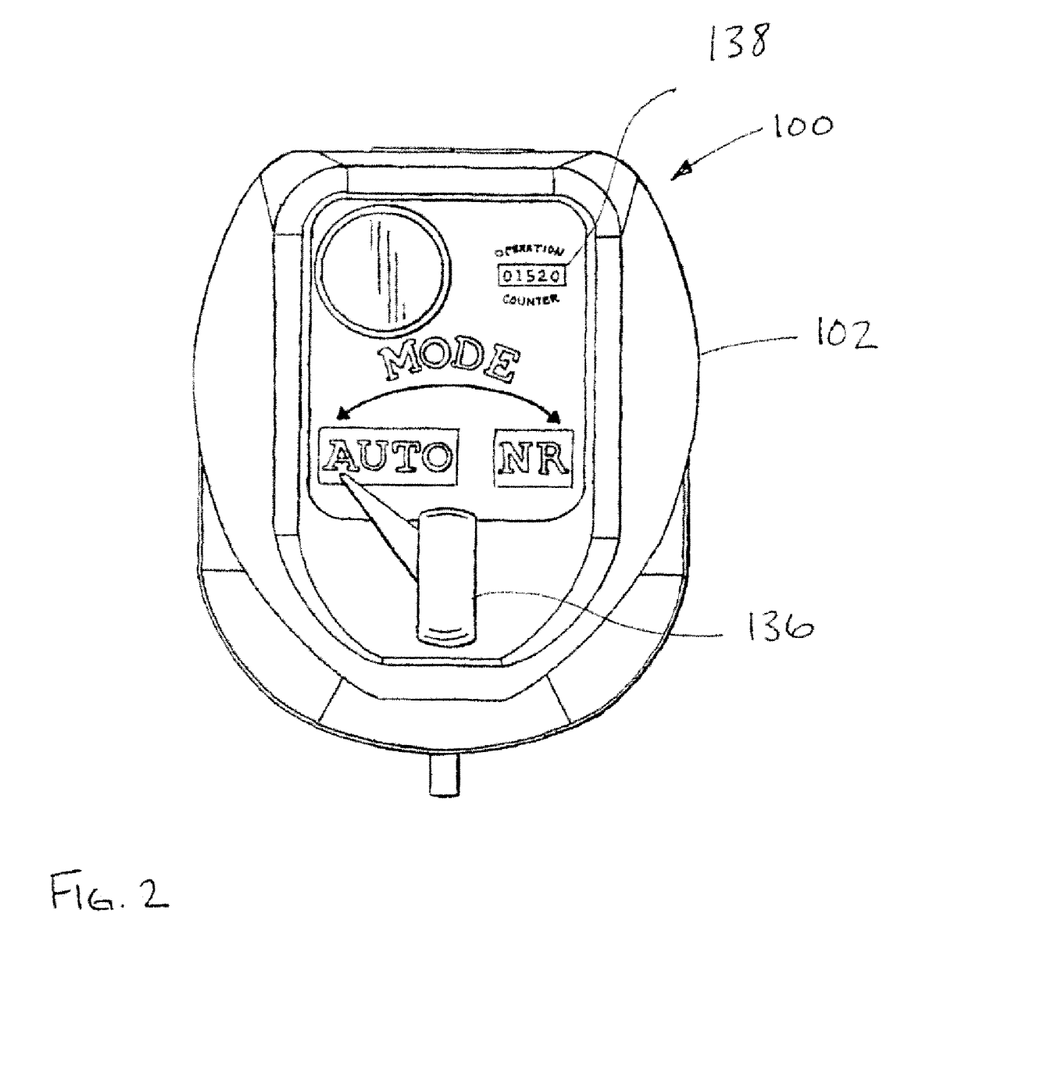
FIG. 2 is a bottom view of the fault interrupting device illustrated in FIG. 1.

In certain applications it may be desirable to disable the reclose function. In that case, upon a first fault detection the device will release or "drop out" of the mounting to the disconnected position. A selector 136 (FIG. 2) is provided to allow a technician to set the operating mode, automatic (AUTO) or non-reclosing (NR). For example, the selector 136 may include a ring 136 so that the selector 136 may be actuated using a hot stick or other suitable tool from the ground or a bucket truck. A cycle counter 138 may also be provided. The cycle counter 138 provides an indication of the total interrupt cycles, and hence provides an indication of when the device may require service or replacement, a record of fault activity and data for statistical analysis of device and/or system performance.

Figure 3:
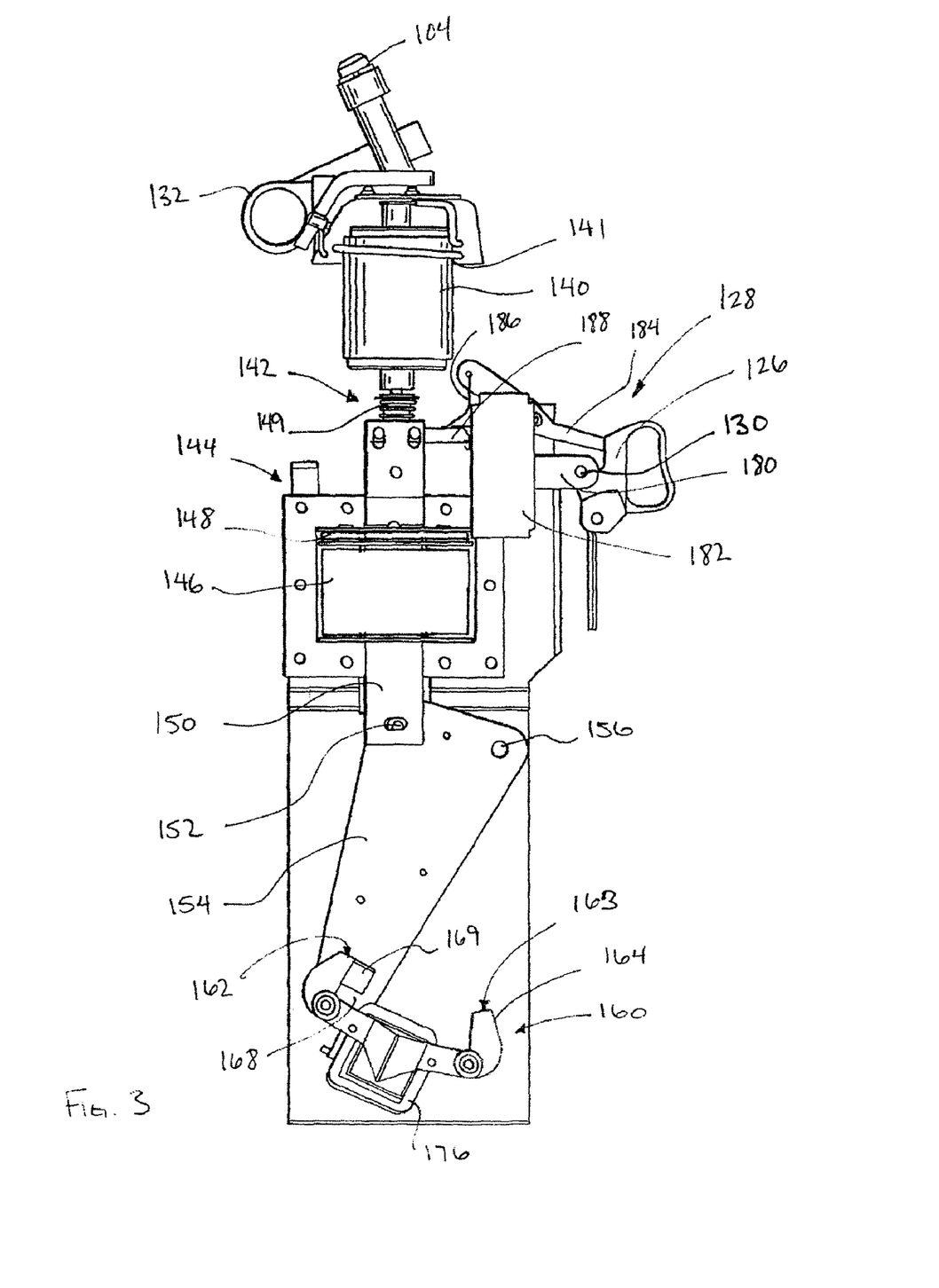
FIG. 3 is a graphic illustration of the operative elements disposed within the housing of the fault interrupting reclosing device of FIG. 1.

Referring to FIG. 3, the device 100 includes a circuit interrupting device 140. The circuit interrupting device 140 may be any suitable device examples of which include vacuum interrupters and arc spinner interrupters. The circuit interrupter 140 may be coupled by an insulating coupling 142 to a solenoid 144. The solenoid 144 may be configured with a first, primary coil 146 conducting the line-to-load current that is used to generate, as a result of a fault current, an opening force on the coupling 142 for actuating the circuit interrupting device 140, for example, exerting an opening force on the contacts of the vacuum interrupter. If the circuit interrupting device is a vacuum interrupter, as depicted in the exemplary embodiment illustrated in FIG. 2, it may include an axial magnetic field coil 141 allowing the vacuum interrupter 140 to interrupt a fault current in excess of that for which it is rated.

The solenoid 144 may further include a secondary coil winding 148 that may be used as a transformer source for providing electrical energy to storage devices (not depicted) such as capacitors for operating the solenoid 144, release latches and the control electronics (not depicted in FIG. 3). The solenoid 144 may also include a spring 149. The spring 149 provides a closing force on the coupling 142 for returning the circuit interrupter to the closed or connected state, for example, by urging the contacts closed. More than one spring may be provided. For example, a first spring may be used to provide a closing force while a second spring is used to provide a biasing force to maintain the contacts in contact. Therefore, the device 100 includes a solenoid 144 operable to provide an opening force (energized coil) and a closing force (spring).

A pin or other suitable coupling 152 couples the solenoid plunger 150 to a lever 154. The lever 154 is mounted within the bracket (not depicted) to pivot about a pivot point 156. The coupling of solenoid plunger 150 to the lever 154 causes pivoting motion of the lever 154 upon extension and retraction of the solenoid plunger 150 relative to the solenoid 144.

Figure 4:
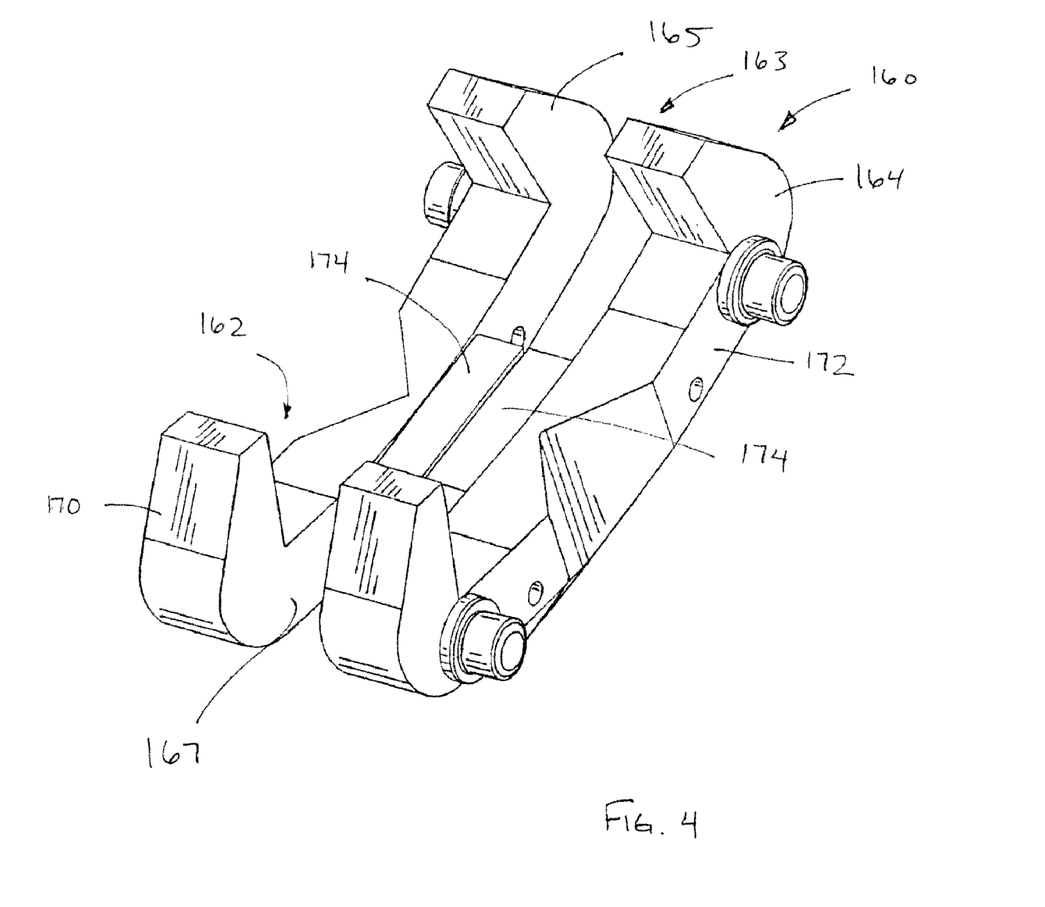
FIG. 4 is a graphic illustration of the latch assembly of the fault interrupting device illustrated in FIG. 1

Referring to FIGS. 3 and 4, the device 100 may further include a latch assembly 160. The latch assembly 160 is secured within the housing 102 and has a generally "C" or claw shape structure including a first latching portion 162 and a second latching portion 163. The latch assembly 160 essentially consists of a pair of electrically controllable "horseshoe" magnets 164 and 165 (magnetic stator pieces); the respective end positions of which define the first latching portion 162 and the second latching portion 163. The magnets 164 and 165 are spaced apart so as to define a slot 167 within which an armature 168 of the lever 154 is disposed. The armature 168 itself may be magnetic or made of magnetic material, or, as depicted, the end may include a magnet insert 169.

The magnet stator 164 and 165 is formed by combining "C" or "horseshoe" shaped permeable members 170 and 172 having magnetic material 174 disposed between them at a specific location. Combined with the magnetic material 174 is a coil 176. The coil 176 is coupled to the control electronics (not depicted) to receive an electric current the effect of which is to neutralize the magnetic field of the magnetic material 174. Absent current in the coil, the magnetic material 174 acts to create a magnetic field shared by the members 170 and 172 within the first and second latching portions 162 and 164 to retain the lever 154 at either of the first or second latching portions 162 and 164, depending on the state of the actuator and the circuit interrupter. The magnetic material may be disposed closer to one end of the "C" shape than the other, such that by its relative position, the magnetic force applied to the magnet insert (armature) 169 may be greater at one latching portion, for example 162, than the other, for example 164. Application of current within the coil acts to neutralize the magnetic field in the first and second latching portions 162 and 164 such that under action of the solenoid 144 the circuit interrupting device may be driven from the closed or connected state to the open or disconnected state, or, under action of the return spring 149, the circuit interrupting device may be driven from the open or disconnected state to the closed or connected state. This is explained in more detail below.

With the solenoid 144 in the circuit closed position or connected state, the end 168 is disposed adjacent the first latching portion 162. Absent current in the coil 176, a magnetic field is present in the first latching portion 162 that exerts a retaining force on the end 168 and/or the magnetic insert 169, as the case may be. The retaining force resists movement of the end 168, and hence the lever 154, latching it and the solenoid 144, in the circuit closed position. Upon detection of a fault current, the solenoid 144 generates a force on the solenoid plunger 150 to open the circuit interrupting device 140. Concomitantly, the control electronics applies a current to the coil 176 neutralizing the magnetic field releasing the lever 154. Axial movement of the solenoid plunger 150 in conjunction with the opening of the circuit interrupter causes the lever 154 to rotate such that the end 168 is disposed adjacent the second latching portion 164. The current is removed from the coil 176 restoring the magnetic field such that the second latching portion 164 exerts a force on the end 168, which resists movement of the end 168 and latches the lever 154, and hence the solenoid 144, in the circuit open position or disconnected state. Current may be removed from the coil 176 at any point in the travel of the lever 154, to minimize the energy drawn from the energy storage means. The force of the magnet, in combination with the mechanical advantage provided by having the magnetic act on the end 168 relative to the pivot 156, provides sufficient force to resist the closing force exerted by the spring. Of course, it should be understood that in other embodiments, various combinations of linkages, gears or other force-multiplying arrangements may be employed.

To close the circuit interrupting device, the current is again applied to the coil 176 to neutralize the magnetic field. With the magnetic field neutralized, the lever 154 is free to move and the spring has sufficient strength to force circuit interrupting device 140 to the closed position or connected state. Once the end 168 is substantially disengaged from the second latching portion 164, the current within the coil 176 is terminated restoring the magnetic field and the retaining magnetic force. The lever 154 is again latched on contacting the first latching portion 162. Thus, the latch assembly 160 provides for latching the solenoid 144 in both the circuit open position/disconnected state and the circuit closed position/connected state. The required mechanical advantage and magnet strength is determined for the particular application. For example, the latch assembly 160 in combination with the mechanical advantage may provide a hold force that is greater than the solenoid acting force, e.g. two or more times the solenoid acting force.

A flexible conductive strap (not depicted) may couple from a moving contact 172 of the circuit interrupter 140 to the solenoid 144 for providing electrical power to the first coil 146 and the second coil 148. The flexible strap may also couple fault current to the solenoid 144. When a fault current exists, the fault current passing through the solenoid coil 146 develops an axial force sufficient to drive the circuit interrupter to an open/disconnected state. Once opened, the circuit interrupter 140 is held open by the latching capability of the latch 160 acting on the lever 154.

A controller, not depicted in FIG. 3, is operable upon fault detection to energize the coil 176 to negate the magnetic field of the magnetic material 174 to allow the solenoid 144 to drive the circuit interrupter 140 to the open state. The controller is also operable to energize the coil 176 to negate the magnetic field of the magnetic material 174 to allow the circuit interrupter 140 to close under action of the spring 149. Once the contacts are closed, the circuit interrupter 140 again conducts, and current is coupled by the strap to the solenoid coil. If the fault current persists, the device 100 again acts to open the circuit.

The controller is operable to provide for and manage reclose attempts, and for example, to provide a delay between reclose attempts and to count the number of reclose attempts. Should the number of reclose attempts exceed a threshold value, then the device 100 may be caused to drop out. The controller further may restrain the solenoid until its release will result in the minimum arcing time at the contacts of the interrupter while still assuring successful latching in the circuit open position.

The release mechanism 128 includes the sliding contact pivot member 126 coupled by an arm 180 to an actuator 182. As noted, the member 126 is disposed within the trunnion 124, and the device 100 is able to pivot about the trunnion 124 when the contact 104 is not engaged with the contact 122. The controller is operable to cause the actuator 182 to drive the member 126 within the trunnion 124 to release the device 100 form the mounting 110, for example, by causing it to pivot about the trunnion 124. Once the device 100 has dropped out, after the persistent fault is corrected it is necessary for a technician to reconnect the device 100 using a hot stick or other suitable tool to engage the hook ring 132 and move the device 100 back into the connected state.

To prevent release of the device 100 from the mounting 110 when the circuit interrupter 140 is in the closed/connected state, the release mechanism 128 includes a latch 184 that is mounted to the device 100 and is coupled by a clip 186 to a release member 188. The clip 186 may be a semi-rigid link as shown, or other arrangement to engage the release member 188 at some point in its travel. The release member 188 is coupled to the solenoid plunger 150 for movement therewith. With the circuit interrupter 140 in the closed state, the latch 184 engages the member 126 preventing movement thereof that would cause a release of the device 100 from the mounting 110. The latch 184 is held in place by the member 188 and the latching of the plunger 150, as described above. With the circuit interrupter 140 in the open disconnected state as is cause by movement of the plunger 150, the member 188 is moved with the plunger 150 releasing the latch 184 from the member 126.

Figure 5:
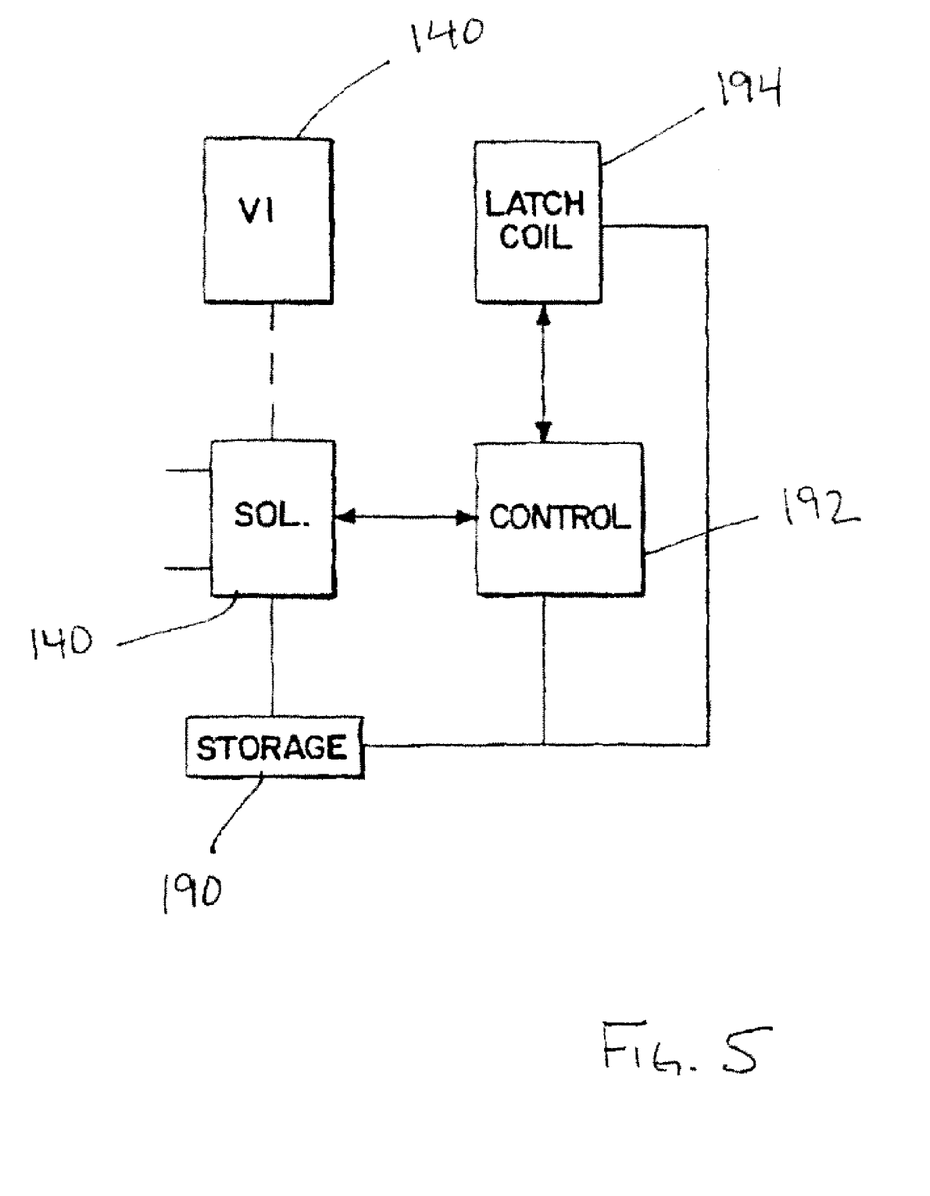
FIG. 5 is a block diagram illustrating the operational and control elements for a fault interrupting reclosing device.

The block diagram of FIG. 5 illustrates the solenoid 144 mechanically coupled to the circuit interrupter 140. The solenoid 144 also couples to an energy storage device 190, such as a capacitor, series of capacitors, battery or fuel cell. A controller 192 couples to the solenoid to monitor the number of interrupt operations as well as to energize the coil 176 to release the latch 160. The controller 192 also couples to the actuator 182 in order to effect drop out, if necessary. Finally, the controller 192 couples to the counter 138.

In accordance with one possible operating logic, the device 100 may nominally conduct a given continuous current (A), and may be configured to provide 5 times to 40 times the continuous rated current fault clearing capability, Fault current above a fault threshold value causes the solenoid 144 to operate to open the circuit interrupter 140. Currents below fault threshold do not cause operation of the solenoid 144 to open the circuit interrupter 140.

Upon detecting a fault current, the device 100 operates to clear the first detected fault current. The controller may then implement a reclose strategy. For example, a relatively quick reclose may be effected. If the fault remains, a time delay may be implemented before a second reclose attempt. If the fault persists after the second reclose attempt, the device 100 may be caused to release or "drop out." The reclose strategy, number of attempts and delay intervals, may be preset. Alternatively, an interface may be provided to the controller 192 to allow for programming the reclose strategy. On recognizing that the circuit interrupter 140 has completed a preset number of operations, or some other "end-of-life" condition has been detected by the controller 192, the controller 192 may block the reclose strategy, and cause the unit to drop out or disconnect after opening. In this way, the device 100 provides positive indication that its capability has become impaired and remedial action or outright replacement is required.

The device 100 may be configured to weigh less than about 25 lbs (10 kg) so that it may be installed by a technician from a bucket truck, although larger or smaller versions may be envisioned based upon the intended application. The fault interrupting and reclosing capability of the device 100 may greatly reduce or minimize the number of extended interruptions. The effect of momentary interruptions may be minimized, and the device 100 may preserve downstream equipment, for example, transformer fuses.

Figure 6:
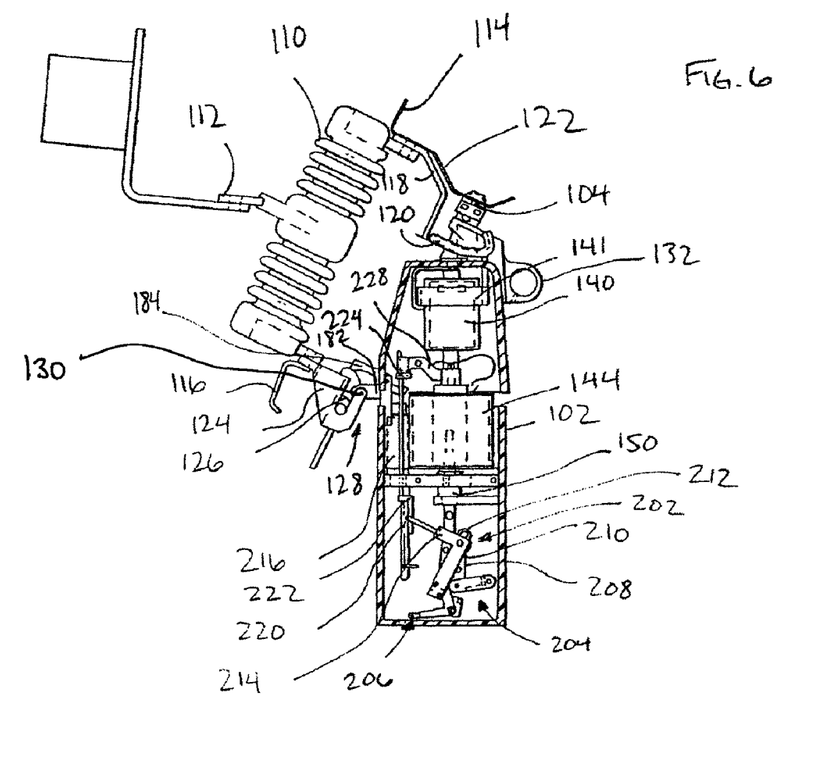
FIG. 6 is a graphic illustration of a fault interrupting reclosing device incorporating a mechanical latching mechanism.

FIG. 6 illustrates a fault interrupting reclosing device 200. Like reference numerals refer to like or similar elements as described in connection with the device 100 depicted in FIG. 1. The device 200 operates in a manner essentially the same as the device 100; however, it incorporates a mechanical latching mechanism 202 replacing the permanent magnet 160 configuration of the device 100.

In response to a fault current, the solenoid 144 operates to open the contacts of the circuit interrupter 140. The latching system 200 includes a primary latch 204 and a secondary latch 206 that prevent the solenoid 144 from closing the contacts due to the force provided by the spring 149. The latches 204 and 206 are coupled to a driver 208 that is operable in response to axial movement of the solenoid shaft 152. As the driver 208 rotates counterclockwise with axial movement of the shaft 152 away from the solenoid 144, a set of double acting leaf springs 210 are charged through a rotating spreader 212 secured to the driver 208. The force generated by the leaf springs 210 rotate an arm 214 counterclockwise. Rotation of the arm 214 is resisted by a dashpot 216. The dashpot 216 is used as a timer that acts in the pull direction. As the leaf springs 210 equalize the force of the dashpot 216, a rod 220 moves the secondary latch 206 that in turn releases the primary latch 204. The energy stored in the spring 149 closes the circuit interrupter 140, and the mechanism 200 returns to its top of stroke position. A quick return mechanism may be employed that is engaged only when the vacuum interrupter is closed by the spring 149 to reset the mechanism 200.

If a persistent fault occurs, a rotating cam 224 operated by a spring-mass system 226 moves into position between the actuator 182 and a drive member 228. The cam 224 causes the drive member 228 to engage the actuator 182 for driving the member 126. With the latch 184 released, the engagement of the drive member 228 with the actuator 182 causes release of the device 200 from the mounting 110. The release of the device 200 from the mounting 110 provides a visual indication that the circuit is open. If, however, no fault occurs upon the spring 145 fully closing the circuit interrupter 140, the circuit interrupter 140 closes and the device 200 is reset. A one-shot to lockout feature also may be provided.

As described above, a fault interrupting and reclosing device, such as the device 100, may include a cycle counter 138. The cycle counter 138 provides an indication of the total interrupt cycles, and hence provides an indication of when the device may require service or replacement, a record of fault activity and data for statistical analysis of device and/or system performance. As known for vacuum fault interrupters, each interrupting cycle results in contact material erosion and redistribution to the other internal surfaces of the vacuum fault interrupter. Furthermore, various characteristics of the interrupted fault current and/or operation of the fault interrupting and reclosing device may affect the extent of material erosion and corresponding contact degradation. However, as an alternative to setting a fixed number of operating cycles for the device, it is possible to utilize the operating parameter monitoring and processing capability of the fault interrupting and reclosing device, such as the device 100, to adaptively predict the end-of-life/remaining operational life of the vacuum interrupter.

As further described above, and with reference again to FIG. 5, a fault interrupting and reclosing device, such as the device 100, may include a controller 192. The controller 192, in addition to containing within a memory thereof a control program to effect operation of the device 100 for fault interrupting and circuit reclosing, may also contain and implement a control program for monitoring various characteristics and/or parameters of the interrupted fault current and characteristics and/or parameters of the associated operation of the device 100 to clear the fault. The control program may be stored within the memory as stored software, firmware, application specific hardware or by any suitable means that allows for the control to operate as described herein to effect device operation, operational life determination and/or other functionality.

In one possible embodiment of such a control program, the control 192 looks to at least one, and potentially several predictive parameters, such as fault current characteristics and device operating characteristics to provide an end of life calculation. For such an exemplary embodiment, the control 192 may measure, track or otherwise monitor the magnitude of the system frequency fault current and the ratio of the asymmetry of the current peaks of the cycle of current immediately preceding the interruption of the fault current. In addition to these fault current characteristics, the control 192 may monitor one or more device operating characteristics, such as the clearing time of the fault current interruption operation. An adaptive predicted end-of-life (EOL) may then be determined based upon these parameters. The predicted EOL may be determined in terms of the fault magnitude and clearing times for the fault current interruption, and this value may be maintained with the memory of the control 192 or otherwise retained within the device 100 in a non-volatile manner.

The relationship of the summed fault current magnitudes, asymmetry ratios and clearing time products from preceding fault current interruptions to a threshold obtained from experimentally verified modeling for predicting EOL is set forth in Equation (1):

$$\text{Cumulative \% Life Consumed} = \frac{\sum_{k=1}^{n}\left(i_k^2 t_k \left|\frac{i_{1_k}}{i_{2_k}}\right|\right)}{K} \qquad (1)$$

where:
i=pre-interruption RMS fault current with DC offset removed (A)
$i_1$=asymmetric value of the most positive peak of the cycle of current preceeding the fault (A)
$i_2$=asymmetric value of the most negative peak of the cycle of current preceeding the fault (A)
t=fault current interruption clearing time (s)
k=operation number
n=number of operations performed
K=experimentally determined life constant In an alternative embodiment, the information may be cumulatively collected and processed using an iterative approach. Equation (2) sets forth a relationship among fault current magnitudes, asymmetry ratios and clearing time products from preceding fault current interruptions in an iterative manner:

$$\text{Cumulative \% Life Consumed} = \% \, Life_{k-1} + \frac{i_k^2 t_k \left| \frac{i_{1_k}}{i_{2_k}} \right|}{K} \quad (2)$$

where the equation values are as indicated above.

Additional factors may be considered to determine the various values, e.g., single operation percent life consumed, maximum single occurrence percent life consumed, cumulative percent life consumed, etc. For example, factors may include the degree of asymmetry present in the current at the time of interruption of the current. The quantification of the degree of asymmetry could be made by normalizing the DC current magnitude to the peak value of the 60 Hz current. Alternatively, the total asymmetric RUMS value could be produced. The factors may also include the fault clearing time. Evaluating the time that current continues to flow past the opening of the vacuum interrupter and comparing that to a specified maximum time could provide an indication that the vacuum interrupter has reached the end of its useful current interrupting service life. In such an embodiment, the clearing time threshold for making this determination may be set to be less than the specified maximum clearing time for the device to provide appropriate margin. Additional mathematical models and calculations may also be considered for defining the relationship between the various factors and the vacuum interrupter useful current interrupting service life including power law formulae, or base e exponential formulae.

The control 192 may be operable to retain a record of a maximum single fault percent life quantity, i.e., a maximum percent of life consumed by one fault, from the last several fault current interruption events. For example, the control 192 may retain data on the last N events, where N is an integer. The value of N is arbitrary, but should be sufficiently large to be statistically significant. In one possible embodiment, the value of N may be 16, but as noted, it may be any statistically significant value. The value should be sufficiently large to allow for changes in the system (e.g., increases in available fault current or varying load characteristics that change the asymmetry of the fault) or relocation of the device 100 itself to another part of the system.

The control 192 may then determine whether the vacuum interrupter has sufficient remaining life for the device 100 to withstand a predetermined number of additional events of similar magnitude. For example, the control 192 may calculate if two more operations will exceed the useful remaining life of the vacuum interrupter, although any number of operations may be used based upon the application. If the vacuum interrupter does not have sufficient life to operate to clear the two additional events, the device 100 will signal its EOL on the next fault event. The device 100 may signal its EOL using associated communication capability. It may also or alternatively be caused to drop out, as described above, signaling a need to replace the device.

Figure 7:
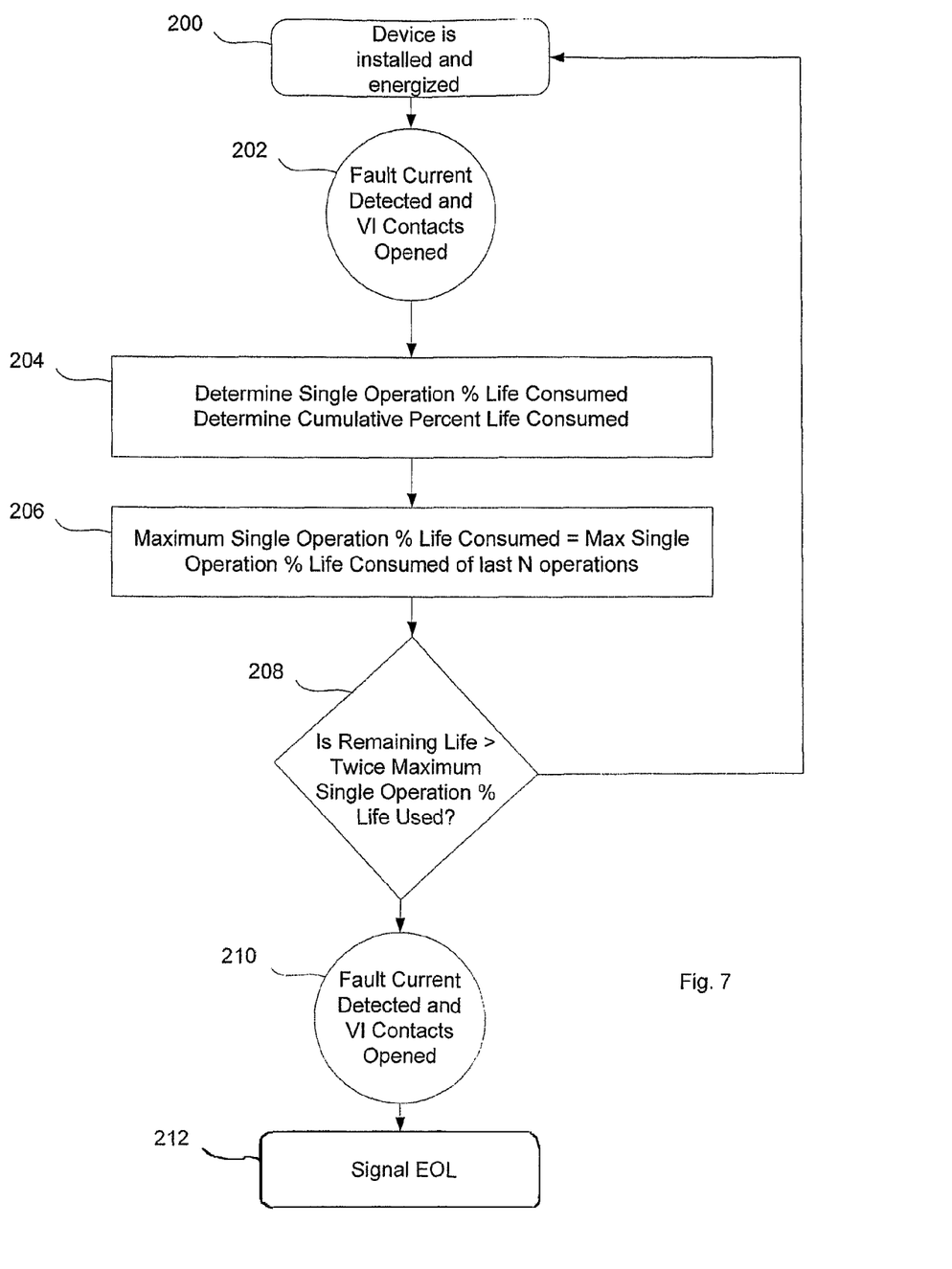
FIG. 7 is a flowchart illustrating a method to determine operational life of a vacuum fault interrupter.

FIG. 7 illustrates an exemplary operating sequence for determining a remaining operational life, i.e., an EOL, of a fault interrupting and reclosing device. At block 200 the device is installed and made operational, i.e., energized, in its mounting. At block 202, a fault current is detected, and the device operates, i.e., the vacuum interrupter is caused to open its contacts, to clear the fault. At block 204 a single operation percent life used is determined. The single operation percent life used may be determined based upon equation (3):

$$\text{single operation \% life used} = i_k^2 t_k \quad (3).$$

Single operation percent life used values may be retained for the last N operations for statistical or other system monitoring reasons but also to be used as explained below. Also determined at block 204 is the cumulative percent life consumed, which can be determined in accordance with either equation (1) or equation (2), above.

Next, a determination is made whether the device has sufficient remaining life to remain in normal service. One approach may be to make a comparison to determine if the cumulative percent life consumed (e.g., the value of either equation (1) or (2)) exceeds a threshold value. Alternatively, a comparison may be made to determine if the device has sufficient remaining life to interrupt one or more faults of a particular character. For example, a test may be set to determine whether the device has sufficient life to interrupt a predetermined number of occurrences of the maximum single operation percent life used. The maximum single operation percent life used may be a preset value, for example one that is determined experimentally, or it may be dynamically determined. In one exemplary embodiment, the maximum single operation percent life used is set by taking the single operation percent life used values, for example calculated in accordance with equation (3), from the preceding N operations and selecting the maximum of these values. Then, it may be determined whether the device has sufficient life to interrupt a set number, e.g., two, occurrences of the maximum single operation percent life used. Of course still other suitable measures to determine whether the device has reached nearly the end of its useful life may be used.

In the exemplary method illustrated in FIG. 7, at block 206, the maximum single operation percent life used may be determined by taking the maximum single operation percent life value calculated for the preceding 16 fault interruptions. At block 208, the remaining device life is then compared to twice the maximum single operation percent life used value, for example according to the equation:

$$100\% - \text{Cummulative \% life used} > 2 * \text{max single operation \% life used} \quad (4).$$

A true result at block 208 signals the remaining life of the device is greater than twice the maximum single operation percent life used. The device may remain in normal operation, and the method repeats. A false result, however, results in the device being placed into an EOL operation mode. In this mode, upon occurrence of the next fault current, block 210, the device will operate to clear the fault, but it is then also caused to signal its EOL, block 212, for example by dropping out of position.

In addition to simply predicting device EOL that results, for example, in the permanently dropped out state with the next occurring fault clearing, the various determined values, e.g., single operation percent life consumed, maximum single occurrence percent life consumed, cumulative percent life consumed, etc., may be used to trigger any of several adaptive device responses to events and possibly even while those events are still occurring. One such response might be to trigger a closing of the vacuum interrupter if the clearing time of a single interruption event has passed a predefined limit of time indicative of breakdown within the vacuum interrupter. Keeping the device closed, i.e., keeping the vacuum interrupter within the device closed would cause upstream system protection devices to operate to clear the fault.

A second possible response could be to initiate an EOL signalling, for example, dropping out of the device, following a fault current interruption event that produced sufficient current and/or that experienced sufficiently long clearing times as to cause the EOL limit to be exceeded. The dropping out action following a vacuum interrupter opening without dropping out might require that the vacuum interrupter first be closed to set up the operating mechanism for the drop out operation. The dropping out action following a vacuum interrupter opening that did not include a drop out operation could be implemented using capacitive stored energy to drive the operating mechanism to produce the requisite drop out force. Alternatively, detonation of a small charge or operation of another suitable mechanism could provide the required force.

While the present disclosure is susceptible to various modifications and alternative forms, certain embodiments are shown by way of example in the drawings and the herein described embodiments. It will be understood, however, that this disclosure is not intended to limit the invention to the particular forms described, but to the contrary, the invention is intended to cover all modifications, alternatives, and equivalents defined by the appended claims.

It should also be understood that, unless a term is expressly defined in this patent using the sentence "As used herein, the term '______' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. § 112, sixth paragraph.

We claim:

1. A fault interrupting reclosing device comprising:
a circuit interrupter coupled between a source and a load of a power distribution system, the circuit interrupter having a closed, connected state and an open, disconnected state;
an actuator coupled to the circuit interrupter, the actuator adapted to exert upon the circuit interrupter an operating force to drive the circuit interrupter from the closed state to the open state and alternatively from the open state to the closed state;
a pivot and a release latch, the pivot and release latch adapted to engage a mounting structure to provide an electrical connection of the device to the source and the load via the mounting structure, the device being rotatable about the pivot within the mounting structure upon release of the release latch from the mounting structure;
the device having an automatic mode of operation and a non-reclosing mode of operation;
the automatic mode of operation comprising operation of the actuator to move the circuit interrupter into the open state in the response to a fault in the power distribution system, to move the circuit interrupter to the closed state following a predetermined time period after the fault and to move the circuit interrupter into the open state with persistence of the fault; and
the non-reclosing mode of operation comprising operation of the actuator to move the circuit interrupter into the open state and release of the release latch to allow the device to rotate about the pivot within the mounting structure, the non-reclosing mode of operation following an automatic mode of operation and persistence of the fault.

2. The device of claim 1, comprising a controller, the controller coupled to the actuator to control the operation of the actuator to implement the automatic mode and the non-reclosing mode.

3. The device of claim 2, the controller further comprising resources to control the actuator to affect the non-reclosing mode in lieu of the automatic mode of operation after detecting predetermined conditions.

4. The device of claim 3 wherein the predetermined conditions include a predetermined number of operations or an end-of-life condition.

5. The device of claim 1, comprising a release member coupled to the actuator and moveable with the actuator to engage and release the release latch.

6. The device of claim 1, the release latch comprising a permanent magnet and a coil.

7. The device of claim 1, the actuator comprising a solenoid for providing the opening force and a spring for providing the closing force.

8. The device of claim 1, further comprising
a latch coupled to the actuator, with the circuit interrupter in the closed state the latch holding the actuator in the closed state until a fault current exists to cause opening of the circuit interrupter and with the circuit interrupter in an open state the latch holding the circuit interrupter in the open state, the latch comprising a magnet adapted to engage the actuator and a coil coupled to the magnet, the coil being operable to selectively nullify the magnetic field of the magnet.

9. The device of claim 8, the latch comprising a lever coupled to the actuator to pivot responsive to axial movement of a shaft of the actuator from a first position to a second position, the permanent magnet engaging the lever in each of the first position and the second position.

10. The device of claim 9, wherein the permanent magnet comprises a first latching portion and a second latching portion, the lever being aligned with the first latching portion when the lever is in the first position and the lever being aligned with the second latching portion with the lever is in the second position.

11. The device of claim 1, in the non-reclosing mode of operation the release latch physically disengaging from the mounting structure providing a visible indication of operation of the device in the non-reclosing mode.

* * * * *